US007629194B1

(12) United States Patent
Schaffner et al.

(10) Patent No.: US 7,629,194 B1

(45) Date of Patent: Dec. 8, 2009

(54) METAL CONTACT RF MEMS SINGLE POLE DOUBLE THROW LATCHING SWITCH

(75) Inventors: James H. Schaffner, Chatsworth, CA (US); Tsung-Yuan Hsu, Westlake Village, CA (US); Adele E. Schmitz, Newbury Park, CA (US); Hui-Pin Hsu, Northridge, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/845,602

(22) Filed: Aug. 27, 2007

Related U.S. Application Data

(62) Division of application No. 11/006,426, filed on Dec. 6, 2004, now Pat. No. 7,280,015.

(51) Int. Cl.
*H01L 21/00* (2006.01)

(52) U.S. Cl. ........................................................ 438/52

(58) Field of Classification Search .................... 438/52
See application file for complete search history.

(56) References Cited

U.S. PATENT DOCUMENTS

| | | | | |
|---|---|---|---|---|
| 5,121,089 | A | 6/1992 | Larson | 333/107 |
| 6,040,611 | A * | 3/2000 | De Los Santos et al. | 257/415 |
| 6,046,659 | A | 4/2000 | Loo et al. | 333/262 |
| 6,440,767 | B1 | 8/2002 | Loo et al. | 438/52 |
| 6,496,612 | B1 | 12/2002 | Ruan et al. | 385/18 |
| 7,101,724 | B2 * | 9/2006 | Chou | 438/48 |
| 2004/0180465 | A1 * | 9/2004 | Musolf et al. | 438/52 |

OTHER PUBLICATIONS

Jensen, B.D., et al., "Design Optimization of Fully-Complaint Bistant Micro-Mechanism," *Proceedings of 2001 ASME International Mechanical Engineering Congress and Exposition*, New York, New York, pp. 1-7 (Nov. 11-16, 2001).

Sun, Xi-Qing, et al., "A Bistable Microrelay Based on Two-Segment Multimorph Cantilever Actuators," *The Eleventh Annual International Workshop on Micro-electro Mechanical Systems*, pp. 154-159 (Jan. 25-29, 1998).

* cited by examiner

*Primary Examiner*—Ha Tran T Nguyen
*Assistant Examiner*—Shaun Campbell
(74) *Attorney, Agent, or Firm*—Ladas & Parry

(57) ABSTRACT

Apparatus for a micro-electro-mechanical switch that provides single pole, double throw switching action. The switch has two input lines and two output lines. The switch has a seesaw cantilever arm with contacts at each end that electrically connect the input lines with the output lines. The cantilever arm is latched into position by frictional forces between structures on the cantilever arm and structures on the substrate in which the cantilever arm is disposed. The state of the switch is changed by applying an electrostatic force at one end of the cantilever arm to overcome the mechanical force holding the other end of the cantilever arm in place.

15 Claims, 3 Drawing Sheets

METAL CONTACT RF MEMS SINGLE POLE DOUBLE THROW LATCHING SWITCH

CROSS-REFERENCE TO RELATED APPLICATIONS

This application is a divisional of U.S. application Ser. No. 11/006,426, filed on Dec. 6, 2004, now U.S. Pat. No. 7,280, 015, the disclosure of which is incorporated herein by reference.

BACKGROUND

1. Technical Field

The present invention relates generally to switches. More particularly, it relates to microfabricated electromechanical switches having a single pole double throw configuration with the ability to latch.

2. Description of Related Art

Switch networks are found in many systems applications. For example, in satellite systems, switch networks are essential for routing matrices and redundancy systems. Future satellite systems will not only require larger switch routing networks, but also increased functionality for network-centric operations. These new capabilities will include spacecraft reconfiguration for beam switching, beam shaping, and frequency agility. Thus, it is expected that satellites will require an increasing number of switches in their payloads.

In many cases, these switches need to be latching, that is, once they are actuated they will remain in a desired state even after the actuation energy source is removed. Some of the applications where latching switches are important are ultra-reliable networks where power interruptions could create a problem, such as satellite or Unmanned Air Vehicles, or networks where supplied power is limited, like in small mobile platforms that run on batteries. Current latching switch technology typically relies on magnetic or motor drives to change switch states. These switches, typically fabricated using coaxial conductors or metallic waveguides, generally work very well. However, most of the applications listed above would benefit from size and weight reduction since the mechanical latching switches currently in use tend to be larger and heavier than desired. Semiconductor switches, such as made using PIN diodes and FET switches, are small, but they typically cannot latch in multiple states without a constant energy source.

Radio Frequency (RF) Micro Electro-Mechanical System (MEMS) switches are known in the art to have small size and weight and are also known to provide desirable performance in the radio frequency and microwave spectrums. Several types of MEMS switches are well-known in the art. For example, U.S. Pat. No. 5,121,089 issued Jun. 9, 1992 to Larson discloses a microwave MEMS switch. The Larson MEMS switch utilizes an armature design. One end of a metal armature is affixed to an output line, and the other end of the armature rests above an input line. The armature is electrically isolated from the input line when the switch is in an open position. When a voltage is applied to an electrode below the armature, the armature is pulled downward and contacts the input line. This creates a conducting path between the input line and the output line through the metal armature. This switch requires a constant voltage to maintain the switch in a closed state.

As another example, U.S. Pat. No. 6,046,659 of Loo et al. discloses methods for the design and fabrication of non-latching single pole single throw MEMS switches. U.S. Pat. No. 6,046,659 is incorporated herein by reference in its entirety. FIG. 1 shows a top view of a MEMS switch 10 according to Loo et al., which provides single pole single throw switching between an input line 20 and an output line 18 when electrically actuated with a DC voltage.

FIGS. 2A and 2B are side-elevational views of the MEMS switch 10. FIG. 2A shows the switch 10 in the open position and FIG. 2B shows the switch 10 in the closed position. Beam structural material 26 is connected to a substrate 14 through a fixed anchor via 32. A suspended armature bias electrode 30 is nested within the structural material 26 and electrically accessed through a bias line 38 at an armature bias pad 34. A conducting transmission line 28 is at the free end of the beam structural layer 26 and is electrically isolated from the suspended armature bias electrode 30 by the dielectric structural layer 26. Contact dimples 24 of the transmission line 28 extend through and below the structural layer 26 and define the areas of metal contact to the input and output lines 20 and 18, respectively. A substrate bias electrode 22 is below a suspended armature bias electrode 30 on the surface of the substrate 14. When a voltage is applied between the suspended armature bias electrode 30 and the substrate bias electrode 22, an electrostatic attractive force will pull the suspended armature bias electrode 30 as well as the attached armature 16 towards the substrate bias electrode 22. The contact dimples 24 touch the input line 20 and the output line 18, so the conducting transmission line 28 bridges the gap between the input line 20 and the output line 18, thereby closing the MEM switch.

Loo et al. generally describe a surface micromachined device. That is, layers are deposited on top of a substrate, and then one or more of the layers is etched away to release the moving parts of the switch 10. As described in Loo et al., the parts of the switch generally comprise gold (or gold alloys) for the switch contacts, silicon dioxide for the one or more layers etched away (i.e., the sacrificial layers), and silicon nitride for the beam structural layer. However, as discussed in additional detail below, switches fabricated according to Loo et al. may exhibit some problems.

The switches fabricated according to Loo et al. are typically fabricated with one layer deposited on the next. With such fabrication, any pattern of one layer may get transferred to each subsequent layer. The dimensions of the switch dielectric and metal layers are typically thin enough that the transferred copies of the initial metal layer pattern (for example, the pattern of the substrate bias electrode 22) appear even at the top nitride layer of the dielectric structural layer 26. Therefore, as layers of $SiO_2$ and $Si_3N_4$ are deposited on top of the bottom metal layer, these dielectric layers may wrap around the bottom metal structures, in particular, the substrate bias electrode 22. In some cases, after the sacrificial silicon dioxide was etched away, the remaining silicon nitride formed a lid that covered the substrate bias electrode 22 when the switch 10 was closed.

The formation of the silicon nitride "lid" is shown in FIG. 5, which illustrates the dielectric structural layer 26 wrapping around the bias electrode 22 disposed on the substrate 14. Because of the tightness of the fit of this nitride "lid" over the bottom electrode, there may be great deal of friction between the lid and the substrate bias electrode 22 when the switch 10 is opened and closed. The friction of the lid may depend upon post-processing used to etch away the sacrificial layer. The lid may be made to fit more loosely over the substrate bias electrode 22 by etching longer, so that some of the silicon nitride is etched away. However, in some cases, the switch 10 would close upon actuation and not open upon the removal of the actuating voltage. Therefore, as indicated above, control of the design of the switch and the processes used to fabricate the switch may be required to avoid the friction problems in the prior art switch according to Loo et al.

An example of a latching micro switch is described in U.S. Pat. No. 6,496,612 issued Dec. 17, 2002 to Ruan et al. Ruan et al. describe a switch having a cantilever to switch between an open state and a closed state. To operate as a latching switch, a permanent magnet is used to maintain the cantilever in an open state or a closed state. However, the use of a permanent magnet may result in a switch that is bigger and/or heavier than desired.

Another example of a latching switch is described by Xi-Qing Sun, K. R. Farmer and W. N. Carr in "A Bistable Micro Relay Based on Two-Segment Multimorph Cantilever Actuators," The Eleventh Annual International Workshop on Micto-electro Mechanical Systems, 1998, MEMS 98 Proceedings, Jan. 25-29, 1998, pp. 154-159. Sun et al. describe a latching switch mechanism that uses two metals to create stresses in opposite directions along a cantilever beam. RF contacts can be moved by controlling the stress on the two segments electrostatically to lengthen or shorten the length of the cantilever along the substrate so that the contact can be moved from one RF line to another. The fabrication of the switch disclosed by Sun et al. may be complicated since two different metals are required. Further, the switch disclosed by Sun et al. requires two independent control voltages to move the switch.

Still another example of a single pole double throw switch is described in U.S. Pat. No. 6,440,767 B1, issued Aug. 27, 2002 to Loo et al. This switch is similar to that described above in U.S. Pat. No. 6,046,659, except that two armatures are used to provide the single pole double throw switching action. As such, the switch may exhibit the same problems described above in regard to the switch disclosed in U.S. Pat. No. 6,046,659.

Therefore, there is a need in the art for a small, lightweight latching switch that does not require an external voltage or magnetic source to stay latched in a selected state.

SUMMARY

Embodiments of the present invention provide for a method and apparatus for switching that is bistable. An embodiment of the present invention comprises a SPDT RF MEMS metal contact switch that is bistable. According to embodiments of the present invention, a non-planar processing technique may be used to provide a switch that sticks in one of two positions when electrostatically actuated. Embodiments of the present invention employ a frictional latching mechanism that is provided by portions of a switch cantilever beam that fit snugly around parts of a metal layer deposited beneath the cantilever beam. Embodiments of the present invention also employ a seesaw switch structure with two actuation electrodes that pull down one side of the cantilever beam or the other.

BRIEF DESCRIPTION OF THE DRAWINGS

These and other features and advantages will become more apparent from a detailed consideration of the invention when taken in conjunction with the drawings described below. However, this invention may be embodied in many different forms and should not be construed as limited to the embodiments depicted in the drawings or described below. Further, the dimensions of certain elements shown in the accompanying drawings may be exaggerated to more clearly show details. The present invention should not be construed as being limited to the dimensional relations shown in the drawings, nor should the individual elements shown in the drawings be construed to be limited to the dimensions shown.

DETAILED DESCRIPTION

It should be appreciated that the particular embodiments shown and described herein are examples of the invention and are not intended to otherwise limit the scope of the present invention in any way. Indeed, for the sake of brevity, conventional electronics, manufacturing, MEMS technologies and other functional aspects of the systems (and components of the individual operating components of the systems) may not be described in detail herein. Furthermore, for purposes of brevity, embodiments of the invention are frequently described herein as pertaining to a micro electro-mechanical switch for use in electrical or electronic systems. It should be appreciated that many other manufacturing techniques could be used to create the embodiments described herein. Further, the embodiments according to the present invention would be suitable for application in electrical systems, optical systems, consumer electronics, industrial electronics, wireless systems, space applications, or any other application. Moreover, it should be understood that the spatial descriptions (e.g. "above", "below", "up"? "down", etc.) made herein are for purposes of illustration only, and that embodiments of the present invention may be spatially arranged in any orientation or manner.

Figure 1:
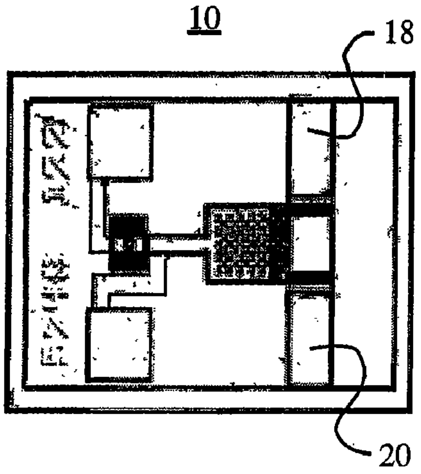
FIG. 1 (Prior Art)
FIG. 1 (prior art) is a top view of a prior art RF MEMS switch.
Figure 5:
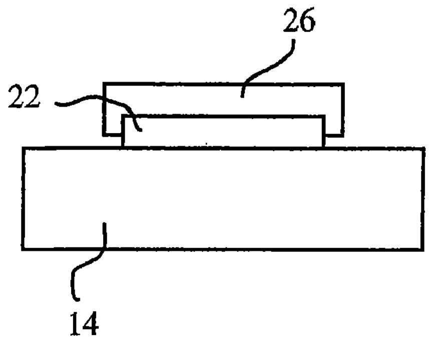
FIG. 5 shows the formation of a lid over metal deposited on a substrate.
Figure 2A:
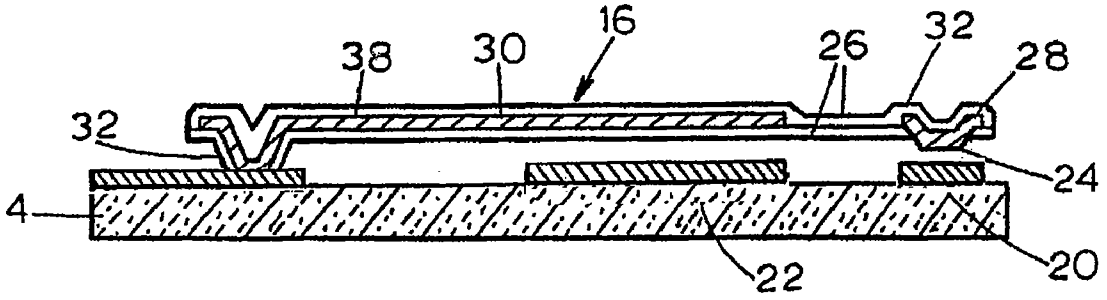
FIG. 2A (Prior Art)
FIG. 2A (prior art) shows a cross-sectional view of the switch in FIG. 1 in an open position.
Figure 2B:
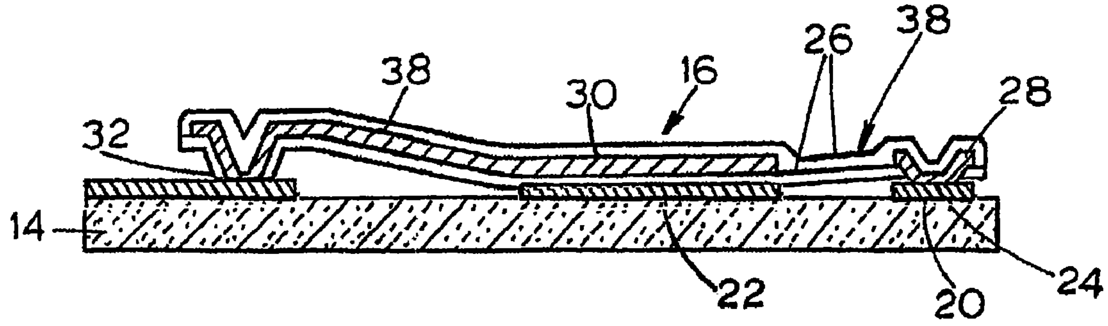
FIG. 2B (Prior Art)
FIG. 2B (prior art) shows a cross-sectional view of the switch in FIG. 1 in a closed position.

As described above and shown in FIG. 5, the deposition of sacrificial silicon dioxide and silicon nitride over a metal layer disposed on a substrate may cause the pattern of the metal layer to appear in the silicon nitride layer. As additionally explained above, this may cause the formation of a "lid" in the silicon nitride layer that causes a cantilever arm in which the lid is formed to stick to the underlying metal layer. As described above, such a feature is generally considered a problem with prior art devices. However, embodiments of the present invention may be designed to rely upon this feature to achieve a desired latching effect.

Embodiments of the present invention use a lid formed in a cantilever arm to hold the switch in position even after the actuation voltage is released. According to embodiments of the present invention, the frictional forces will need to be larger than the spring forces in the cantilever beam which want to restore the cantilever to its equilibrium position. The required relatively large frictional forces may be achieved by a lid created during processing.

Figure 3:
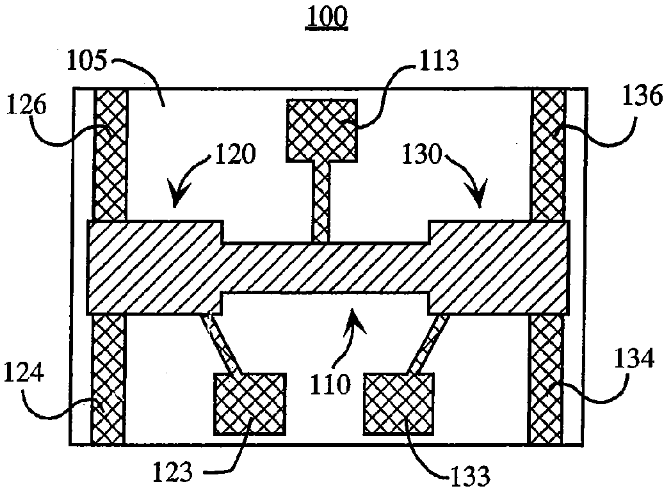
FIG. 3 shows a top view of a switch according to an embodiment of the present invention.

A top view of a switch 100 according to an embodiment of the present invention is shown in FIG. 3. FIG. 3 shows a first input line 126, a first output line 124, a second input line 136, and a second output line 134 disposed on a substrate. The switching function is provided by a seesaw cantilever structure 110 comprising a first cantilever arm 120 and a second cantilever arm 130. The switch 110 is actuated by pivoting the cantilever structure at a cantilever anchor 117 (shown in FIG. 4). Voltages are applied at a first bias pad 123 and/or a second bias pad 133 to cause the cantilever structure to move in a first direction of a second direction due to electrostatic attraction. A common pad 113 provides a return path or ground path.

Figure 4:
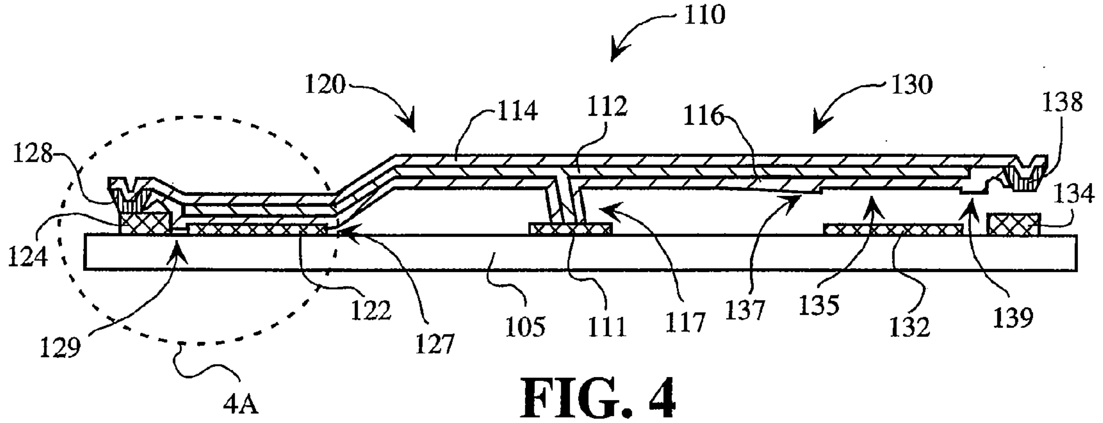
FIG. 4 shows a side view of the switch shown in FIG. 3.

FIG. 4 shows a side view of the switch 100 shown in FIG. 3 and illustrates additional features of the switch 100. As shown in FIG. 4, the cantilever structure 110 comprises a first beam structural layer 116, an armature electrode layer 112, and a second beam structural layer 114. Preferably, the first beam structural layer 116 and the second beam structural layer 114 comprise silicon nitride, but other materials such as polymer materials may be used. The cantilever structure 110 is anchored to the substrate 105 by the cantilever anchor 117, which comprises portions of the first beam structural layer 116 and the armature electrode layer 112. Preferably, the cantilever anchor 117 is flexible to facilitate the latching and unlatching of the switch, as is described in additional detail below. An anchor pad 111 provides an electrical connection between the common pad 113 and the armature electrode layer 112 at the cantilever anchor 117.

The first cantilever arm 120 and the second cantilever arm 130 project from the cantilever anchor 117. The first cantilever arm 120 is disposed over a first substrate bias electrode 122. The first cantilever arm 120 also has a first contact 128 that bridges a gap between the first input line 126 and the first output line 124. When the first cantilever arm 120 is actuated, the first contact 128 provides an electrical connection between the first input line 126 and the first output line 124. Similarly, the second cantilever arm 130 is disposed over a second bias substrate electrode 122. The second cantilever arm 130 also has a second contact 138 that bridges a gap between the second input line 136 and the second output line 134. When the second cantilever arm 130 is actuated, the second contact 138 provides an electrical connection between the second input line 136 and the second output line 134. The switch elements conducting electricity, such as the first contact 128, the first input line 126, the first output line 124, the first substrate bias electrode, etc., preferably comprise gold, but other conducting materials such as aluminum, silver, copper, conducting polymers, etc. may be used.

Figure 4A:
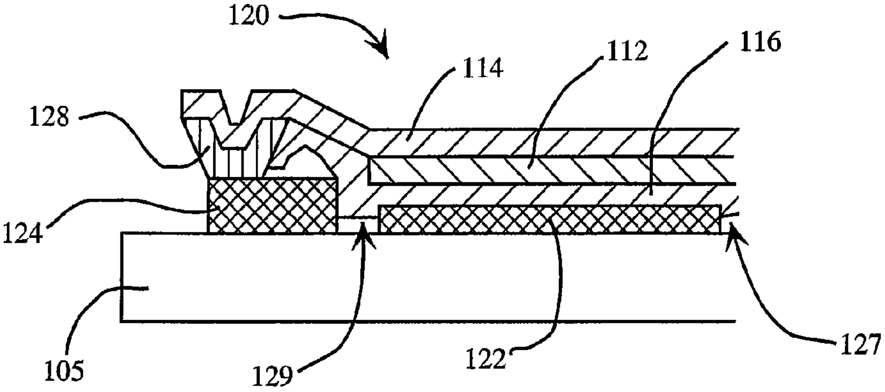
FIG. 4A shows a close up view of a portion of the switch shown in FIG. 4.

FIG. 4A shows a close-up view of the first cantilever arm 120 in the vicinity of the first substrate bias electrode 122 when the first cantilever arm 120 is in the closed position. As shown in FIG. 4A, a first portion 129 of the first beam structural layer 116 projects below the top of the first substrate bias electrode 122 between the first substrate bias electrode 122 and the first input line 126 (not shown) and the first output line 124. FIG. 4A shows the first portion 129 extending from the first substrate bias electrode 122 to the first output line 124, but alternative embodiments according to the present invention have the first portion 129 not touching the first output line 124 or the first input line 126. A second portion 127 of the first beam structural layer 116 projects below the top of the first substrate bias electrode 122 between the first substrate bias electrode 122 and the cantilever anchor 117 (not shown). While FIG. 4A shows only the first portion 129 and the second portion 127 projecting below the top of the first substrate bias electrode 122, the first beam structural layer 116 is preferably fabricated such that it completely surrounds at least a top portion of the first substrate bias electrode 122 when the first cantilever arm 120 is in the closed position so that a first substrate bias electrode lid is provided. That is, it is preferred that a lid is formed in the first beam structural layer 116 that is defined by the outer perimeter of the first substrate bias electrode 122.

Returning to FIG. 4, the formation of the preferred lid is further illustrated by examining the structure of the second cantilever arm 130. As shown in FIG. 4, the second cantilever arm 130 has a first portion 139 and a second portion 137 of the first beam structural layer 116, both projecting from the first beam structural layer 116. The area into which the second substrate bias electrode 132 when the second cantilever arm 130 is closed is illustrated by the recess 135 between the first and second portions 139, 137. Hence, the recess 135 provides a second substrate bias electrode lid for the second substrate bias electrode 132. Those skilled in the art will understand that while FIGS. 4 and 4A show that projected portions of the first beam structural layer 116 provide the lids for the first substrate bias electrode 122 and the second substrate bias electrode 132, other embodiments according to the present invention may provide the lids with recesses in the first beam structural layer 116.

In the switch 100 depicted in FIGS. 3, 4 and 4A, the cantilever anchor 117 becomes a fulcrum to transfer the stress from one side of the cantilever structure 110 to the other. Thus, a single pole double throw switch is provided by the two pairs of input and output lines 126, 124, 136, 134, one pair on each side of the cantilever anchor 117. A selected input line 126, 136 is closed to its corresponding output line 124, 134 by actuating the substrate bias electrode 122, 132 nearest the line, pulling the corresponding cantilever arm 120, 130 down such that the metal contact 128, 138 makes good contact with the RF lines 126, 124, 136, 134.

Preferably, the lid formed in the first beam structural layer 116 fits snugly around the corresponding substrate bias electrode 122, 132. When the actuation voltage is removed, the friction of the lid against the corresponding substrate bias electrode 122, 132 keeps the switch closed. The frictional force may be increased by fabricating the first beam structural layer 116 so that it also provides a tight fit between the corresponding substrate bias electrode 122, 132 and the corresponding input and output lines 126, 124, 136, 134, as shown in FIG. 4A. In this embodiment, the friction of the lid against the corresponding substrate bias electrode 122, 132 and the friction of the first beam structural layer 116 against the corresponding input and output lines 126, 124, 136, 134 will keep the switch closed.

When the other pair of input lines 126, 136 and output lines 124, 134 are to be closed, the cantilever arm 120, 130 on that side is actuated. By having a slightly flexible cantilever anchor 117, the stress on cantilever structure 110 from the first side is transferred to the second side and overcomes the friction forces holding the cantilever arm 120, 130 on the first side in place. Thus, cantilever arm 120, 130 on the first side will be released, while the cantilever arm 120, 130 on the second side will close and be latched in place.

It is noted that the electrostatic force required to close the switch depends on the voltage applied to the substrate bias electrodes 122, 132. In experiments with prior art devices such as those disclosed by Loo et al., actuation voltages up to 100 V cause no breakdown in the device. Therefore, it is expected that embodiments of the present invention may use similar voltages. Further, a simple current differentiation circuit may provide the actuation voltage over a relatively short time used to switch the switch. After that, the control circuits would be shut down until it was time to switch again. Hence, it can be seen that embodiments of the present invention do not require a voltage to be constantly applied to retain the switch in a desired state.

FIGS. 6A-6F illustrate the manufacturing processes embodying the present invention used to fabricate the switch

100 of FIGS. 3, 4 and 4A. FIGS. 6A-6F present a side profile of the switch 100 similar to that shown in FIG. 4.

The process begins with the substrate 105. In a preferred embodiment, GaAs is used as the substrate 105. Other materials may be used, however, such as InP, ceramics, quartz or silicon. The substrate is chosen primarily based on the technology of the circuitry the MEMS switch is to be connected to so that the MEMS switch and the circuit may be fabricated simultaneously. For example, InP can be used for low noise HEMT MMICS (high electron mobility transistor monolothic microwave integrated circuits) and GaAs is typically used for PHEMT (pseudomorphic HEMT) power MMICS.

Figure 6A:
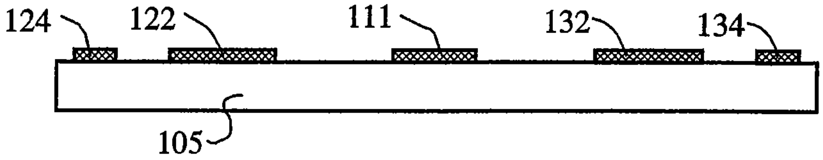
FIGS. 6A-6F show the fabrication of a switch according to an embodiment of the present invention.

FIG. 6A shows a profile of the switch 100 after the first step of depositing a first metal layer onto the substrate 105 for the first output line 124 (the first input line 126 is not shown), the first substrate bias electrode 122, the anchor pad 111, the second substrate bias electrode 132, and the second output line 134 (the second input line 136 is not shown) is complete. The metal layer may be deposited lithographically using standard integrated circuit fabrication technology, such as resist lift-off or resist definition and metal etch. In the preferred embodiment, gold (Au) is used as the primary composition of the first metal layer. Au is preferred in RF applications because of its low resistivity. In order to ensure the adhesion of the Au to the substrate, a 900 angstrom layer of gold germanium is deposited, followed by a 100 angstrom layer of nickel, and finally a 1500 angstrom layer of gold. The thin layer of gold germanium (AuGe) eutectic metal is deposited to ensure adhesion of the Au by alloying the AuGe into the semiconductor similar to a standard ohmic metal process for any III-V MESFET or HEMT.

Figure 6B:
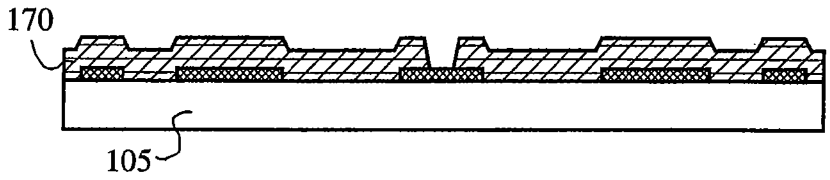

Next, as shown in FIG. 6B, a support layer 170 is placed on top of the first metal layer. As can be seen from FIG. 6B, the upper contour of the support layer 170 generally follows the contour of the metal layer deposited on the substrate. As discussed in additional detail below, this facilitates the formation of the portions 127, 129, 137, 139 of the first beam structural layer used to latch onto the substrate bias electrodes 122, 132. The support layer 170 is also etched to the anchor pad 111 to provide for the formation of the cantilever anchor 117. The support layer 170 may be comprised of 2 microns of $SiO_2$, which may be sputter deposited or deposited using PECVD (plasma enhanced chemical vapor deposition) or using other techniques known in the art. Etching the support layer to provide for the formation of the cantilever anchor 117 may be performed using standard resist lithography and etching. Other materials besides $SiO_2$ may be used as the support layer 170. The important characteristics of the support layer 170 are a high etch rate, good thickness uniformity, and conformal coating by the oxide of the metal already on the substrate 105. The thickness of the support layer 170 partially determines the thickness of the switch opening, which affects the voltage necessary to close the switch as well as the electrical isolation of the switch when the switch is open. The support layer 170 will be removed in the final step to release the first and second cantilever arms 120, 130, as shown in FIG. 6F.

Another advantage of using $SiO_2$ as the support layer 170 is that $SiO_2$ can withstand high temperatures. Other types of support layers, such as organic polyimides, harden considerably if exposed to high temperatures. This makes the polyimide sacrificial layer difficult to later remove. The support layer 170 is exposed to high temperatures when the silicon nitride for the beam structural layers 114, 116 is deposited, as a high temperature deposition is desired when depositing the silicon nitride to give the silicon nitride a lower HF etch rate.

Figure 6C:
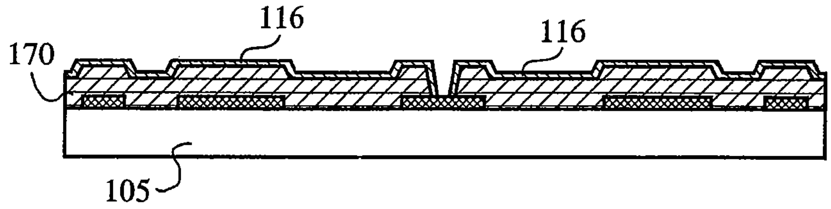

FIG. 6C shows the fabrication of the first beam structural layer 116. The first beam structural layer 116 is preferably deposited by PECVD, but other techniques known in the art may be used. The first beam structural layer 116 is the supporting mechanism of the first and second cantilever arms 120, 130 and preferably comprises silicon nitride, although other materials besides silicon nitride may be used. Silicon nitride is preferred because it can be deposited so that there is neutral stress in the first beam structural layer 116. Neutral stress fabrication reduces the bowing that may occur when the switch is actuated. The material used for the first beam structural layer 116 should have a low etch rate compared to the support layer 170 so that the first beam structural layer 116 (and the second beam structural layer 114) are not etched away when the support layer 170 is removed to release the first and second cantilever arms 120, 130.

As shown in FIG. 6C, the first beam structural layer 116 basically follows the contours of the first metal layer deposited on the substrate 105. That is, the patterns of the first substrate bias electrode 122 and the second substrate bias electrode 132 are transferred to the first beam structural layer 116, due to the thinness of the first beam structural layer 116. As described above, this facilitates the latching of the first beam structural layer 116 to the first substrate bias electrode 122 and the second substrate bias electrode 132.

After formation, the first beam structural layer 116 is patterned and etched using standard lithographic and etching processes. Note that the first beam structural layer 116 is etched after deposit in the area of the cantilever anchor 117 to provide for the electrical connection to the anchor pad 111.

Figure 6D:
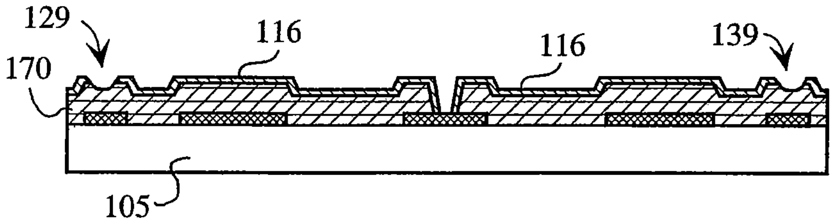
Figure 6E:
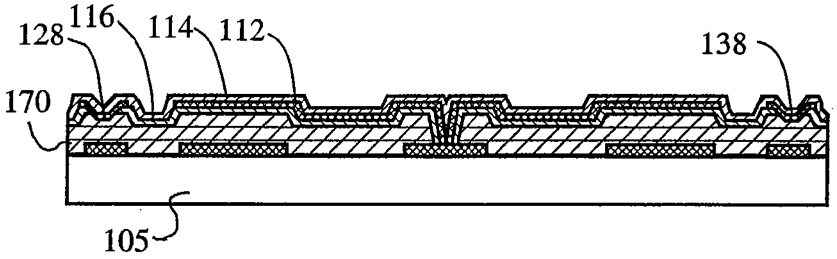
Figure 6F:
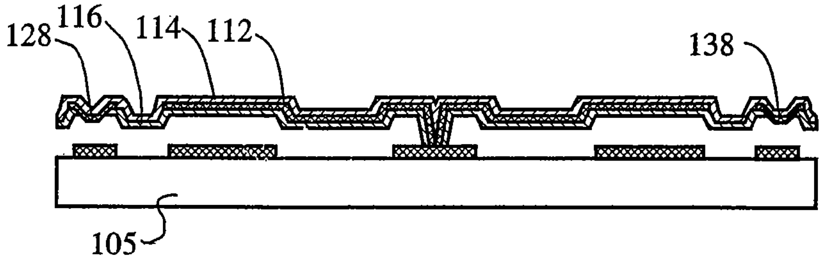

FIG. 6D shows the etching of the first beam structural layer 116 used to form dimple receptacles 129, 139. The dimple receptacles 129, 139 are openings where the first contact 128 and second contact 138 will later be deposited, as shown in FIG. 6E. The dimple receptacles 129, 139 are created using standard lithography and a dry etch of the first beam structural layer 116, followed by a partial etch of the support layer 170. The openings in the first beam structural layer 116 allow the first contact 128 and second contact 138 to protrude through the first beam structural layer 116.

Next, as shown in FIG. 6E, a second metal layer is deposited onto the first beam structural layer 116. The second metal layer forms the armature electrode layer 112 and the first contact 128 and second contact 138. In the preferred embodiment, the second metal layer comprises sputter deposition of a thin film (200 angstroms) of Ti followed by a 1000 angstrom deposition of Au. The thin film should be conformal across the switch and acts as a plating plane for the Au. The plating is done by using metal lithography to open up the areas of the switch that are to be plated. The Au is electroplated by electrically contacting the membrane metal on the edge of a wafer on which the switch (or switches) is fabricated and placing the metal patterned wafer in a plating solution. The plating occurs only where the membrane metal is exposed to the plating solution to complete the electrical circuit and not where the electrically insulating resist is left on the wafer. After 2 microns of Au is plated, the resist is stripped off of the wafer and the whole surface is ion milled to remove the membrane metal. Some Au will also be removed from the top of the plated Au during the ion milling, but that loss is minimal because the membrane is only 1200 angstroms thick.

The result of this process is that the armature electrode layer 112 and the first contact 128 and second contact 138 are created in the second metal layer, primarily Au in the preferred embodiment. In addition, the Au will fill the area of the cantilever anchor 117 and provide the electrical connection between the anchor pad 111 and the armature electrode layer 112.

After the formation of the armature electrode layer 112 and the first contact 128 and second contact 138, the second beam structural layer 112 is deposited. Similar to the first beam structural layer 116, the second beam structural layer 112 may be deposited using PECVD, or other techniques known in the art may be used. The second beam structural layer 112 also preferably comprises silicon nitride.

It is noted that Au is a preferred choice for the second metal layer because of its low resistivity. When choosing the metal for the second metal layer and the material for the beam structural layers 114, 116, it is important to select the materials such that the stress in the beam structural layers 116, 117 will not cause the cantilever arms 120, 130 to bow unacceptably upwards or downwards when actuating. This is done by carefully determining the deposition parameters for the structural layers 116, 117. Silicon nitride is preferred for the structural layers 116, 117 not only for its insulating characteristics, but, in large part, because of the controllability of these deposition parameters and the resultant stress levels of the film.

The beam structural layers 116, 117 may then be further lithographically defined and etched to complete the switch fabrication. Finally, the support layer 170 is removed to release the cantilever arms 120, 130, as shown in FIG. 6F.

If the support layer 170 is comprised of $SiO_2$, it may be wet etched away in the final fabrication sequence by using a hydrofluoric acid (HF) solution. The etch and rinses may be performed with post-processing in a critical point dryer to help ensure that the cantilever arms 120, 130 do not come into contact with the substrate 105 when the support layer 170 is removed. If contact occurs during this process, unacceptable device sticking and switch failure may occur. Contact is prevented by transferring the switch from a liquid phase (e.g. HF) environment to a gaseous phase (e.g. air) environment not directly, but by introducing a supercritical phase in between the liquid and gaseous phases. The sample is etched in HF and rinsed with DI water by dilution, so that the switch is not removed from a liquid during the process. DI water is similarly replaced with ethanol. The sample is transferred to the critical point dryer and the chamber is sealed. High pressure liquid $CO_2$ replaces the ethanol in the chamber, so that there is only $CO_2$ surrounding the sample. The chamber is heated so that the $CO_2$ changes into the supercritical phase. Pressure is then released so that the $CO_2$ changes into the gaseous phase. Now that the sample is surrounded only by gas, it may be removed from the chamber into room air. A side elevational view of the switch 100 after the support layer 170 has been removed is shown in FIG. 6F.

As can be surmised by one skilled in the art, there are many more configurations of the present invention that may be used other than the ones presented herein. It is therefore intended that the foregoing detailed description be regarded as illustrative rather than limiting and that it be understood that it is the following claims, including all equivalents, that are intended to define the scope of this invention.

What is claimed is:

1. A method of fabricating a switch comprising:

providing a substrate;

depositing first conductive material on the substrate to form an anchor pad, a first bias substrate electrode, and a second bias substrate electrode;

depositing a support layer on the first conductive material and the substrate so that an upper contour of the support layer follows a first contour of the first bias substrate electrode;

forming an anchor receptacle in the support layer to expose the anchor pad;

depositing a first beam structural layer on the support layer, the first beam structural layer having a first arm projecting in a first direction from the anchor receptacle and having a second arm projecting in a second direction from the anchor receptacle and a bottom contour in the first arm of the first beam structural layer having a form to provide a means for latching the first bias substrate electrode to the first beam structural layer;

forming a first contact receptacle in the first arm at or near an end of the first arm;

forming a second contact receptacle in the second arm at or near an end of the second arm;

depositing second conductive material on a portion of the first arm, on a portion of the second arm, in the anchor receptacle, and in the first and second contact receptacles;

depositing a second beam structural layer on the first beam structural layer and on the second conductive material; and removing the support layer.

2. The method according to claim 1, wherein depositing the first conductive material further comprises depositing conductive material to form a first input line, a first output line, a second input line, and a second output line.

3. The method according to claim 1, wherein the first contact material comprises a 900 angstrom layer of gold germanium, a 100 angstrom layer of nickel, and a 1500 angstrom layer of gold.

4. The method according to claim 1, wherein forming the first contact receptacle and forming the second contact receptacle comprises etching the first beam structural layer to form openings in the first beam structural layer and partially etching a portion of the support layer in the regions defined by the openings in the first beam structural layer.

5. The method according to claim 1, wherein the second conductive material comprises a 200 angstrom layer of titanium and a 1000 angstrom layer of gold.

6. The method according to claim 1, wherein the support layer comprises silicon dioxide.

7. The method according to claim 6, wherein removing the support layer comprises wet etching with hydrofluoric acid.

8. The method according to claim 1, wherein the first beam structural layer and/or the second beam structural layer comprise silicon nitride.

9. The method according to claim 1, wherein depositing the support layer comprises sputter depositing silicon dioxide using plasma enhanced chemical vapor deposition.

10. The method according to claim 1, wherein the support layer is 2 microns thick.

11. The method according to claim 1, wherein depositing second conductive material comprises sputter deposition of 200 angstrom layer of titanium followed by a deposition of a 1000 angstrom layer of gold.

12. The method according to claim 1, wherein the first arm of the first beam structural layer is formed so that a friction between the first beam structural layer and the first bias substrate electrode may be overcome.

13. The method according to claim 1, wherein:

the support layer on the first conductive material and the substrate has an upper contour that follows a second contour of the second bias substrate electrode; and the bottom contour in the second arm of the first beam structural layer has a form to provide a means for latch ing the second bias substrate electrode to the first beam structural layer.

14. The method according to claim 13, wherein the second arm of the first beam structural layer is formed so that a friction between the first beam structural layer and the second bias substrate electrode may be overcome.

15. The method according to claim 1, wherein:

the first beam structural layer is deposited on the anchor pad through the anchor receptacle; and the first and the second arms are cantilevered at the anchor pad.

* * * * *